(12) United States Patent
Rueckes et al.

(10) Patent No.: US 6,995,046 B2
(45) Date of Patent: Feb. 7, 2006

(54) PROCESS FOR MAKING BYTE ERASABLE DEVICES HAVING ELEMENTS MADE WITH NANOTUBES

(75) Inventors: Thomas Rueckes, Boston, MA (US); Venkatachalam C. Jaiprakash, Fremont, CA (US); Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 7 days.

(21) Appl. No.: 10/824,678

(22) Filed: Apr. 15, 2004

(65) Prior Publication Data

US 2005/0059176 A1 Mar. 17, 2005

Related U.S. Application Data

(60) Provisional application No. 60/464,625, filed on Apr. 22, 2003.

(51) Int. Cl.
H01L 21/335 (2006.01)

(52) U.S. Cl. .................. 438/142; 438/154; 438/800; 977/DIG. 1

(58) Field of Classification Search ................ 438/154, 438/142, 800; 977/DIG. 1
See application file for complete search history.

(56) References Cited

U.S. PATENT DOCUMENTS

| | | | |
|---|---|---|---|
| 3,448,302 A | 6/1969 | Shanefield | |
| 4,845,533 A | 7/1989 | Pryor et al. | |
| 4,853,893 A | 8/1989 | Eaton et al. | |
| 4,876,667 A | 10/1989 | Ross et al. | |
| 4,888,630 A | 12/1989 | Paterson | |
| 5,198,994 A | 3/1993 | Natori | |
| 6,044,008 A | 3/2000 | Choi | |
| 6,048,740 A | 4/2000 | Hsu et al. | |
| 6,128,214 A | 10/2000 | Kuekes et al. | |

(Continued)

FOREIGN PATENT DOCUMENTS

WO    WO 01/03208    1/2001

(Continued)

OTHER PUBLICATIONS

Ajayan, P.M., et al., "Nanometre-size tubes of carbon," Rep. Prog. Phys., 1997, vol. 60, pp. 1025-1062.

(Continued)

*Primary Examiner*—Christian D. Wilson
*Assistant Examiner*—Douglas Menz
(74) *Attorney, Agent, or Firm*—Wilmer Cutler Pickering Hale and Dorr LLP

(57) ABSTRACT

A method of making byte erasable devices having elements made with nanotubes. Under one aspect of the invention, a device is made having nanotube memory elements. A structure is provided having a plurality of transistors, each with a drain and a source with a defined channel region therebetween, each transistor further including a gate over said channel. For a predefined set of transistors, a corresponding trench is formed between gates of adjacent transistors. For each trench, a defined pattern of nanotube fabric is provided over at least a horizontal portion of the structure and extending into the trench. An electrode is provided in each trench. Each defined pattern of nanotube fabric is suspended so that at least a portion is vertically suspended in spaced relation to the vertical walls of the trench and positioned so that the vertically suspended defined pattern of nanotube fabric is electromechanically deflectable into electrical communication with one of the drain and source of a transistor. An electrical communication path is provided electrically connecting each electrode so that all electrodes may electrostatically attract a corresponding defined pattern of nanotube fabric away from a transistor and toward the electrode.

8 Claims, 16 Drawing Sheets

U.S. PATENT DOCUMENTS

| | | | |
|---|---|---|---|
| 6,159,620 | A | 12/2000 | Heath et al. |
| 6,183,714 | B1 | 2/2001 | Smalley et al. |
| 6,198,655 | B1 | 3/2001 | Heath et al. |
| 6,221,330 | B1 | 4/2001 | Moy et al. |
| 6,232,706 | B1 | 5/2001 | Dai et al. |
| 6,445,006 | B1 | 9/2002 | Brandes et al. |
| 6,518,156 | B1 | 2/2003 | Chen |
| 6,548,841 | B2 | 4/2003 | Frazier et al. |
| 6,559,468 | B1 | 5/2003 | Kuekes et al. |
| 6,574,130 | B2 | 6/2003 | Segal et al. |
| 6,643,165 | B2 | 11/2003 | Segal et al. |
| 6,673,424 | B1 | 1/2004 | Lindsay |
| 6,706,402 | B2 | 3/2004 | Rueckes et al. |
| 6,750,471 | B2 | 6/2004 | Bethune et al. |
| 6,759,693 | B2 | 7/2004 | Vogeli et al. |
| 6,774,052 | B2 | 8/2004 | Vogeli et al. |
| 6,781,166 | B2 | 8/2004 | Lieber et al. |
| 6,784,028 | B2 | 8/2004 | Rueckes et al. |
| 6,803,840 | B2 | 10/2004 | Hunt et al. |
| 6,809,465 | B2 | 10/2004 | Jin |
| 6,835,591 | B2 | 12/2004 | Rueckes et al. |
| 2002/0130311 | A1 | 9/2002 | Lieber et al. |
| 2002/0130353 | A1 | 9/2002 | Lieber et al. |
| 2002/0172963 | A1 | 11/2002 | Kelley et al. |
| 2002/0179434 | A1 | 12/2002 | Dai et al. |
| 2003/0021966 | A1 | 1/2003 | Segal et al. |
| 2003/0124325 | A1 | 7/2003 | Rueckes et al. |
| 2003/0165074 | A1 | 9/2003 | Segal et al. |
| 2003/0234407 | A1 | 12/2003 | Vogeli et al. |
| 2003/0236000 | A1 | 12/2003 | Vogeli et al. |
| 2004/0085805 | A1 | 5/2004 | Segal et al. |
| 2004/0159833 | A1 | 8/2004 | Rueckes et al. |
| 2004/0164289 | A1 | 8/2004 | Rueckes et al. |
| 2004/0175856 | A1 | 9/2004 | Jaiprakash et al. |
| 2004/0181630 | A1 | 9/2004 | Jaiprakash et al. |
| 2004/0191978 | A1 | 9/2004 | Rueckes et al. |
| 2004/0214366 | A1 | 10/2004 | Segal et al. |
| 2004/0214367 | A1 | 10/2004 | Segal et al. |
| 2005/0041465 | A1 | 2/2005 | Rueckes et al. |
| 2005/0041566 | A1 | 2/2005 | Rueckes et al. |
| 2005/0047277 | A1 | 3/2005 | Rueckes et al. |
| 2005/0056877 | A1 | 3/2005 | Rueckes et al. |

FOREIGN PATENT DOCUMENTS

| | | |
|---|---|---|
| WO | WO 01/44796 A1 | 6/2001 |
| WO | WO 2003/091486 | 11/2003 |
| WO | WO 2004/065655 | 8/2004 |
| WO | WO 2004/065657 | 8/2004 |
| WO | WO 2004/065671 | 8/2004 |

OTHER PUBLICATIONS

Ami, S. et al., "Logic gates and memory cells based on single $C_{60}$ electromechanical transistors," Nanotechnology, 2001, vol. 12, pp. 44-52.

Avouris, Ph., "Carbon nanotube electronics," Carbon, 2002, vol. 14, pp. 1891-1896.

Casavant, M.J. et al., "Neat macroscopic membranes of aligned carbon nanotubes," Journal of Appl. Phys., 2003, vol. 93(4), pp. 2153-2156.

Choi, W.-B. et al., "Carbon-nanotube-based nonvolatile memory with oxide-nitride-film and nanoscale channel," Appl. Phys. Lett., 2003, vol. 82(2), pp. 275-277.

Cui, J.B. et al., "Carbon Nanotube Memory Devices of High Charge Storage Stability," Appl. Phys. Lett., 2002, vol. 81(17), pp. 3260-3262.

Dai, H. et al., "Controlled Chemical Routes to nanotube Architectures, Physics, and Devices," Phys. Chem . B, 199, vol. 103, pp. 111246-11255.

Dehon, A., "Array-Based Architecture for FET-Based, Nanoscale Electronics," IEEE Transactions on Nanotechnology, 2003, vol. 2(1), pp. 23-32.

Dequesnes, M. et al., "Calculation of pull-in voltages for carbon-nanotube-based nanoelectromechanical switches," Nanotechnology, 2002, vol. 13, pp. 120-131.

Dequesnes, M. et al., "Simulation of carbon nanotube-based nanoelectromechanical switches," Computational Nanoscience and Nanotechnology, 2002, pp. 383-386.

Fan, S. et al., "Carbon nanotube arrays on silicon substrates and their possible application," Physica E, 2000, vol. 8, pp. 179-183.

Farajian, A. A. et al., "Electronic transport through bent carbon nanotubes: Nanoelectromechanical sensors and switches," Phys. Rev. B, 2003, vol. 67, pp. 205423-1 = 205423-6.

Fischer, J.E. et al., "Magnetically aligned single wall carbon nanotube films: Preferred orientation and anisotropic transport properties," Journal of Appl. Phys., 2003, vol. 93(4), pp. 2157-2163.

Franklin, N. R. et al., "Integration of suspended carbon nanotube arrays into electronic devices and electromechanical systems," Appl. Phys. Lett., 2002, vol. 81 (5), pp. 913-915.

Fuhrer, M.S. et al., "High-Mobility Nanotube Transistor Memory," Nano Letters, 2002, vol. 2(7), pp. 755-759.

Homma, Y. et al., "Growth of Suspended Carbon Nanotubes Networks on 100-nm-scale Silicon Pillars," Appl. Phys. Lett., 2002, vol. 81(12), pp. 2261-2263.

Kinaret, J.M. et al., "A carbon-nanotube-based nanorelay," Appl. Phys. Lett., 2003, vol. 82(8), pp. 1287-1289.

Lee, K.-H. et al., "Control of growth orientation for carbon nanotubes," Appl, Phys. Lett., 2003, vol. 82(3), pp. 448-450.

Radosavlievic, M. et al., "Nonvolatile molecular memory elements based on ambipolar nanotube field effect transisitors,"Nano Letters, 2002, vol. 2(7), pp. 761-764.

Robinson, L.A.W., "Self-Aligned Electrodes for Suspended Carbon Nanotube Structures," Microelectronic Engineering, 2003, vol. 67-68, pp. 615-622.

Rueckes, T., et al., "Carbon Nanotube-Based Nonvolatile Random Access Memory for Molecular Computing" Science, 2000, vol. 289, pp. 94-97.

Soh, H. T. et al., "Integrated nanotube circuits: Controlled growth and ohmic contacting of single-walled carbon nanotubes," Appl. Phys. Lett., 1999, vol. 75(5), pp. 627-629.

Sreekumar, T.V., et al., "Single-wall Carbon Nanotube Films", Chem. Mater. 2003, vol. 15, pp. 175-178.

Tans, S. et al., "Room-temperature based on a single carbon nanotube," Nature, 1998.vol. 393, pp. 49-52.

Tour, J. M. et al., "NanoCell Electronic Memories," J. Am. Chem. Soc., 2003, vol. 125, pp. 13279-13283.

Verissimo-Alves, M. et al., "Electromechanical effects in carbon nanotubes: Ab initio and analytical tight-binding calculations," Phys. Rev. B, 2003, vol. 67, pp. 161401-1 = 161401-4.

Wolf, S., Silicon Processing for the VLSI Era; Volume 2—Process Integration, Multi-Level-Interconnect Technology for VLSI and ULSI, 1990, Section 4.3 Materials for Multilevel Interconnect Technologies, pp. 189-191, Lattice Press, Sunset Beach.

Wolf, S., Silicon Processing for the VLSI Era; Volume 2—Process Integration, 1990, Section 4.7 Manufacturing Yield and Reliability Issues of VLSI Inerconnects, pp. 260-273, Lattice Press, Sunset Beach.

Zhan, W., et al., Microelectrochemical Logic Circuits,: J. Am. Chem Soc., 2003, vol. 125, pp. 9934-9935.

PROCESS FOR MAKING BYTE ERASABLE DEVICES HAVING ELEMENTS MADE WITH NANOTUBES

CROSS-REFERENCE TO RELATED APPLICATIONS

This application claims priority under 35 USC §119(e) to the following application, which is hereby incorporated by reference in its entirety:

"Byte Erasable Process", U.S. Provisional Pat. Apl. Ser. No. 60/464,625, filed on Apr. 22, 2003.

The following applications are related and are hereby incorporated by reference in their entirety:

"Electro-Mechanical Switches and Memory Cells Using Horizontally-Disposed Nanofabric Articles and Methods of Making the Same", U.S. Provisional Pat. Apl. Ser. No. 60/446,783), filed on Feb. 12, 2003;

"Electro-Mechanical Switches and Memory Cells Using Vertically-Disposed Nanofabric Articles and Methods of Making the Same", U.S. Provisional Pat. Apl. Ser. No. 60/446,786), filed on Feb. 12, 2003;

"Combined Three Terminal and Four Terminal Nanotube/FET Structures", U.S. Provisional Pat. Apl. Ser. No. 60/512,602, filed on Oct. 16, 2003;

"NRAM Bit Selectable Two-Device Nanotube Array", U.S. application Ser. No. 10/810,962, filed on Mar. 26, 2004;

"NRAM Byte/Block Released Bit Selectable One-Device Nanotube Array", U.S. application Ser. No. 10/810,963, filed on Mar. 26, 2004;

"Single Transistor With Integrated Nanotube (NT-FET)", U.S. application Ser. No. 10/811,191, filed on Mar. 26, 2004; and "Nanotube-On-Gate FET Structures And Applications", U.S. application Ser. No. 10/811,356, filed on Mar. 26, 2004.

BACKGROUND

1. Technical Field

The present application relates to the manufacture of devices using transistors and nanotube switching elements and in which the nanotube switching element records the informational state of the device.

2. Discussion of Related Art

Currently, most memory storage devices utilize a wide variety of energy dissipating devices which employ the confinement of electric or magnetic fields within capacitors or inductors respectively. Examples of state of the art circuitry used in memory storage include FPGA, ASIC, CMOS, ROM, PROM, EPROM, EEPROM, DRAM, MRAM and FRAM, as well as dissipationless trapped magnetic flux in a superconductor and actual mechanical switches, such as relays.

An FPGA (Field Programmable Gate Array) is a programmable logic device (PLD), a programmable logic array (PLA), or a programmable array logic (PAL) with a high density of gates, containing up to hundreds of thousands of gates with a wide variety of possible architectures. The ability to modulate (i.e. effectively to open and close) electrical circuit connections on an IC (i.e. to program and reprogram) is at the heart of the FPGA (Field programmable gate array) concept.

An ASIC (Application Specific Integrated Circuit) chip is custom designed for a specific application rather than a general-purpose chip such as a microprocessor. The use of ASICs can improve performance over general-purpose CPUs, because ASICs are "hardwired" to do a specific job and are not required to fetch and interpret stored instructions.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM (Electrically-erasable programmable read-only memories) has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

EEPROMS are widely used within the computer industry to store a BIOS (basic input-output system) for a computer, sensor, or processing device, allowing it to load data and system instructions from other storage media when the unit receives first power after being in a quiescent state. The size of the BIOS is typically minimized in design because of the high cost of flash memory.

DRAM (dynamic random access memory) stores charge on capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiple writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994, 6,048,740; and 6,044,008.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and poor reliability and has not reached a state of commercialization. See U.S. Pat. Nos. 3,448,302; 4,845,533; and 4,876,667.

Wire crossbar memory (MWCM) has also been proposed. See U.S. Pat. Nos. 6,128,214; 6,159,620; and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, Jul. 17, 2000. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The use of an electromechanical bi-stable device for digital information storage has also been suggested (c.f. U.S. Pat. No. 4,979,149: Non-volatile memory device including a micro-mechanical storage element).

The creation and operation of a bi-stable nano-electromechanical switches based on carbon nanotubes (including mono-layers constructed thereof) and metal electrodes has been detailed in a previous patents and patent application of Nantero, Inc. (U.S. Ser. Nos. 09/915,093, 09/915,173, 09/915,095, 10/033,323, 10/033,032, 10/128,118, 10/128,117, 10/341,005, 10/341,055, 10/341,054, 10/341,130, 60/446,783 and 60/446,786, add 41 the contents of which are hereby incorporated by reference in their entireties).

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, Jul. 17, 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. patent application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. patent application Publication No. 2003-0124325, three-trace architectures may be used for electromechanical memory cells, in which the two of the traces are electrodes to control the deflection of the ribbon.

SUMMARY

The present invention provides a method of making byte erasable devices having elements made with nanotubes.

Under one aspect of the invention, a device is made having nanotube memory elements. A structure is provided having a plurality of transistors, each with a drain and a source with a defined channel region therebetween, each transistor further including a gate over said channel. For a predefined set of transistors, a corresponding trench is formed between gates of adjacent transistors. For each trench, a defined pattern of nanotube fabric is provided over at least a horizontal portion of the structure and extending into the trench. An electrode is provided in each trench. Each defined pattern of nanotube fabric is suspended so that at least a portion is vertically suspended in spaced relation to the vertical walls of the trench and positioned so that the vertically suspended defined pattern of nanotube fabric is electromechanically deflectable into electrical communication with one of the drain and source of a transistor. An electrical communication path is provided electrically connecting each electrode so that all electrodes may electrostatically attract a corresponding defined pattern of nanotube fabric away from a transistor and toward the electrode.

Under another aspect of the invention, a defined pattern of nanotube fabric includes the application of pre-formed nanotubes to create a layer of nanotubes.

Under one aspect of the invention, the layer is substantially a monolayer of nanotubes.

Under one aspect of the invention, the layer is a highly porous fabric of nanotubes.

Under one aspect of the invention, the layer of nanotubes is a conformal fabric of nanotubes.

Under one aspect of the invention, the nanotubes are single walled carbon nanotubes.

Under one aspect of the invention, the suspended length of nanotube fabric has an extent that is sub-lithographic-critical-dimension.

Under one aspect of the invention, the vertically suspended pattern of nanotube fabric is vertically aligned with a corresponding one of the drain or source of the transistor and is electromechanically deflectable into contact with a conductive element extending vertically from the corresponding one of the drain or source of the transistor.

DETAILED DESCRIPTION

Figure 1:
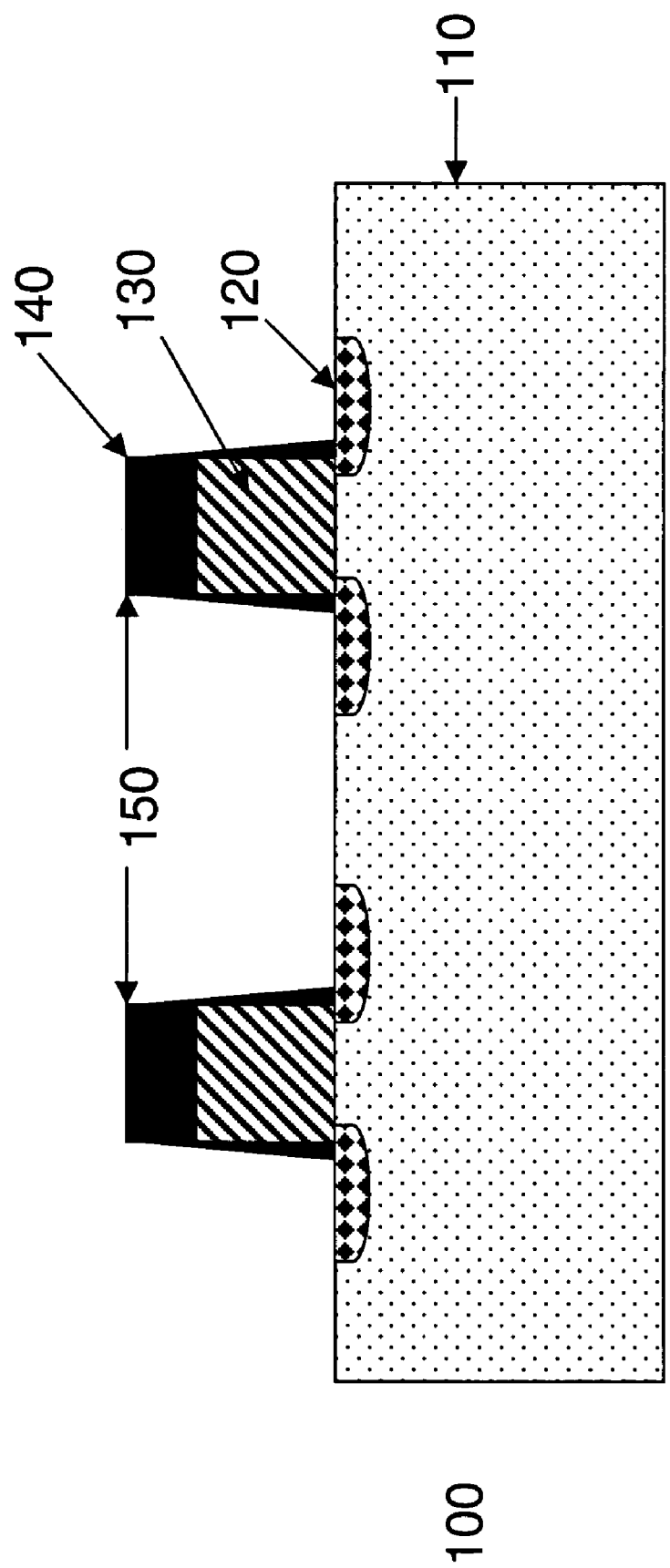
FIGS. 1–16 illustrate intermediate and final structures from sequential steps of a method of creating structures according to one embodiment of the invention.

The device made by the present invention can be described by its cell size. For a bit selectable, Byte/Word erasable cell, 1T-cell, (a one transistor cell) the minimum cell size would be 8 $F^2$, ($F^2$ is a reference to the smallest feature size, squared.) Advantages of using this method include, that most likely no new tooling would be required to perform the methods in a fabrication plant. Nanotubes are dispensed by regular spin-coating and patterned using traditional lithography. Nanotube switching element requires controlled air gap and anchor to structures adjacent to the gap.

A typical nanotube device is composed of a nanofabric as described in U.S. patent application Ser. No. 09/915,093, Electromechanical Memory Array Using Nanotube Ribbons and Method for Making Same, filed Jul. 25, 2001 (NAN-1); U.S. patent application Ser. No. 09/915,173, Electromechanical Memory Having Cell Selection Circuitry Constructed with Nanotube Technology, filed Jul. 25, 2001 (NAN-2);

U.S. patent application Ser. No. 09/915,095, Hybrid Circuit Having Nanotube Electromechanical Memory, Jul. 25, 2001 (NAN-3); U.S. patent application Ser. No. 10/033,323, Electromechanical Three-Trace Junction Devices, filed Dec. 28, 2001 (NAN-4); U.S. patent application Ser. No. 10/033,032, Methods Of Making Electromechanical Three-Trace Junction Devices, filed Dec. 28, 2001 (NAN-5); U.S. patent application Ser. No. 10/128,118, Nanotube Films And Articles, filed Apr. 23, 2002, (NAN-6); U.S. patent application Ser. No. 10/128,117, Methods Of Nanotube Films And Articles, filed Apr. 23, 2002 (NAN-7); U.S. patent application Ser. No. 10/341,005, Methods Of Making Carbon Nanotube Films, Layers, Fabrics, Ribbons, Elements And Articles, filed Jan. 13, 2003 (NAN-15); U.S. patent application Ser. No. 10/341,055, Methods Of Using Thin Metal Layers To Make Carbon Nanotube Films, Layers, Fabrics, Ribbons, Elements And Articles, filed Jan. 13, 2003 (NAN-16); U.S. patent application Ser. No. 10/341,054, Methods Of Using Pre-Formed Nanotubes To Make Carbon Nanotube Films, Layers, Fabrics, Ribbons, Elements And Articles, filed Jan. 13, 2003 (NAN-17); and U.S. patent application Ser. No. 10/341,130, Carbon Nanotube Films, Layers, Fabrics, Ribbons, Elements And Articles, filed Jan. 13, 2003 (NAN-18). In at least some cases, to create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). The nanofabric is patterned using photolithographic techniques generating an electrically conductive trace of nanotubes, NT.

FIG. 1 illustrates a first intermediate structure 100 according to one aspect of the invention. A substrate 110, having source and drain regions 120, gates 130 and nitride 140, covering the gates, is provided. The appropriate ground rule for the following processes is dependent upon the desired device performance and application, but the process flow is compatible with lithographic processes from many microns to sub 100 nm and below. The substrate may preferably be made of silicon, but any semiconducting material, e.g. gallium arsenide, can serve as substrate 110. Embedded in substrate 102 are source and drain regions 120. Gate material can be any material suitable as a field effect transistor gate, including but not limited to; metals, conductors or semiconductors, including nanofabric made of carbon nanotubes. The gates are covered by first nitride layer 140 or other suitable insulator. The nitride layer 140 having substantially planar top surface 150.

Figure 2:
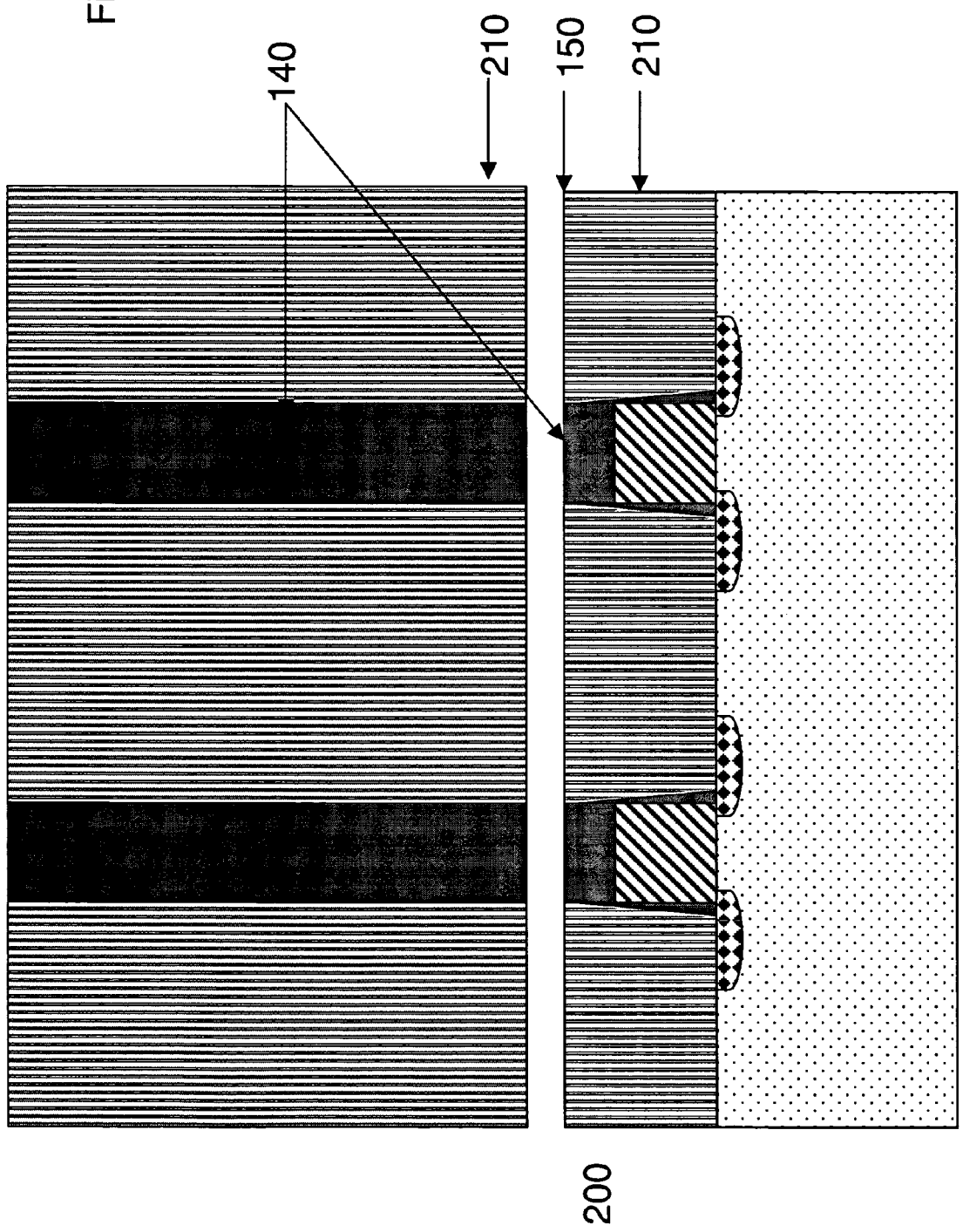

FIG. 2 illustrates intermediate structure 200 in cross sectional view and plan views. Oxide layer 210 is deposited on intermediate structure 100 and is planarized such that the top surface of oxide layer 210 is substantially level with top surface 150, as illustrated.

Figure 3:
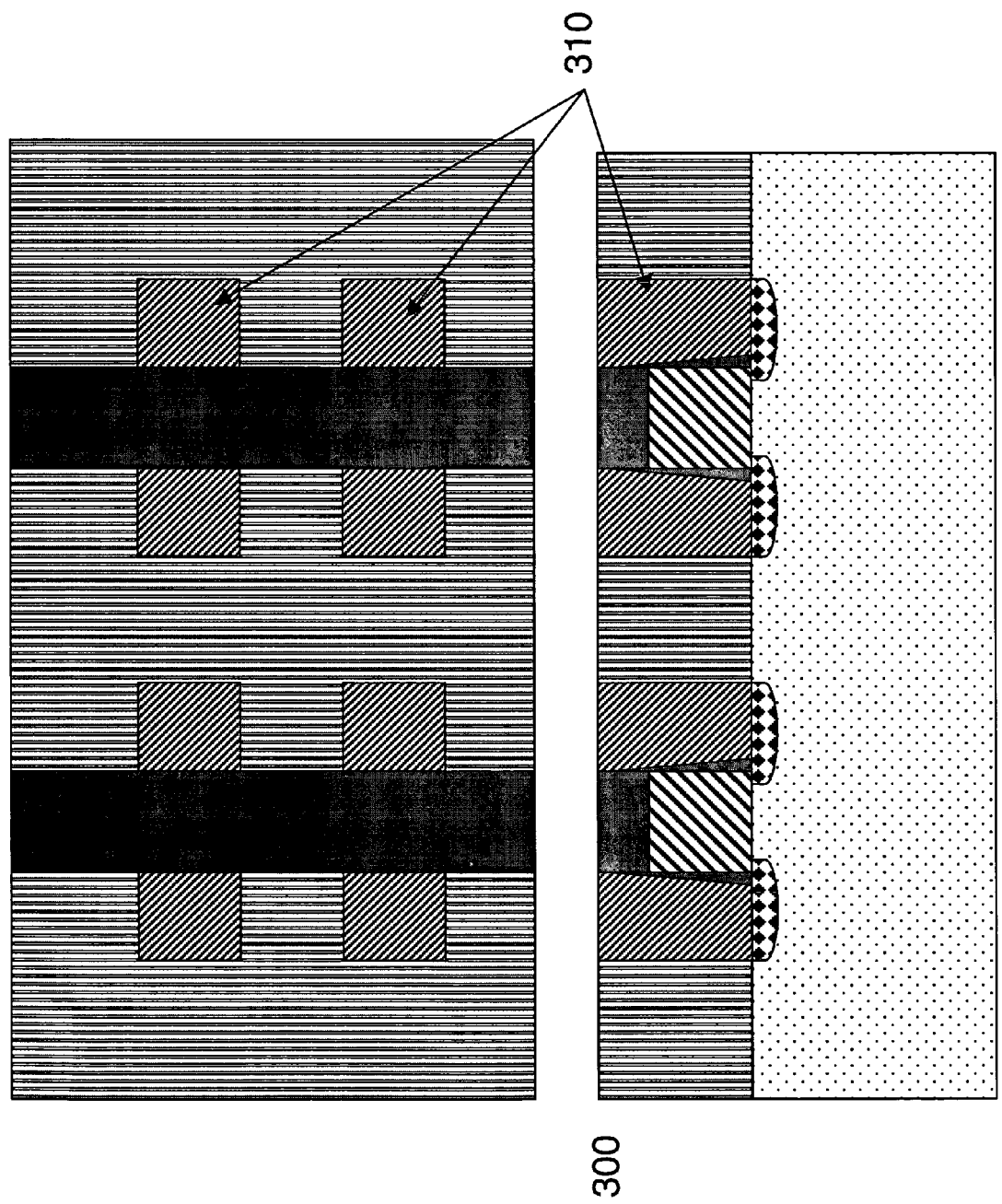

Regions adjacent to gates 130 are etched and polysilicon is deposited such that polysilicon fills the spaces adjacent to gates 130, resulting in self-aligned contacts 310 forming intermediate structure 300 as illustrated by FIG. 3. Alternatively, self-aligned contacts 310 can be made of any suitable conductor, including, but not limited to metals etc.

Figure 4:
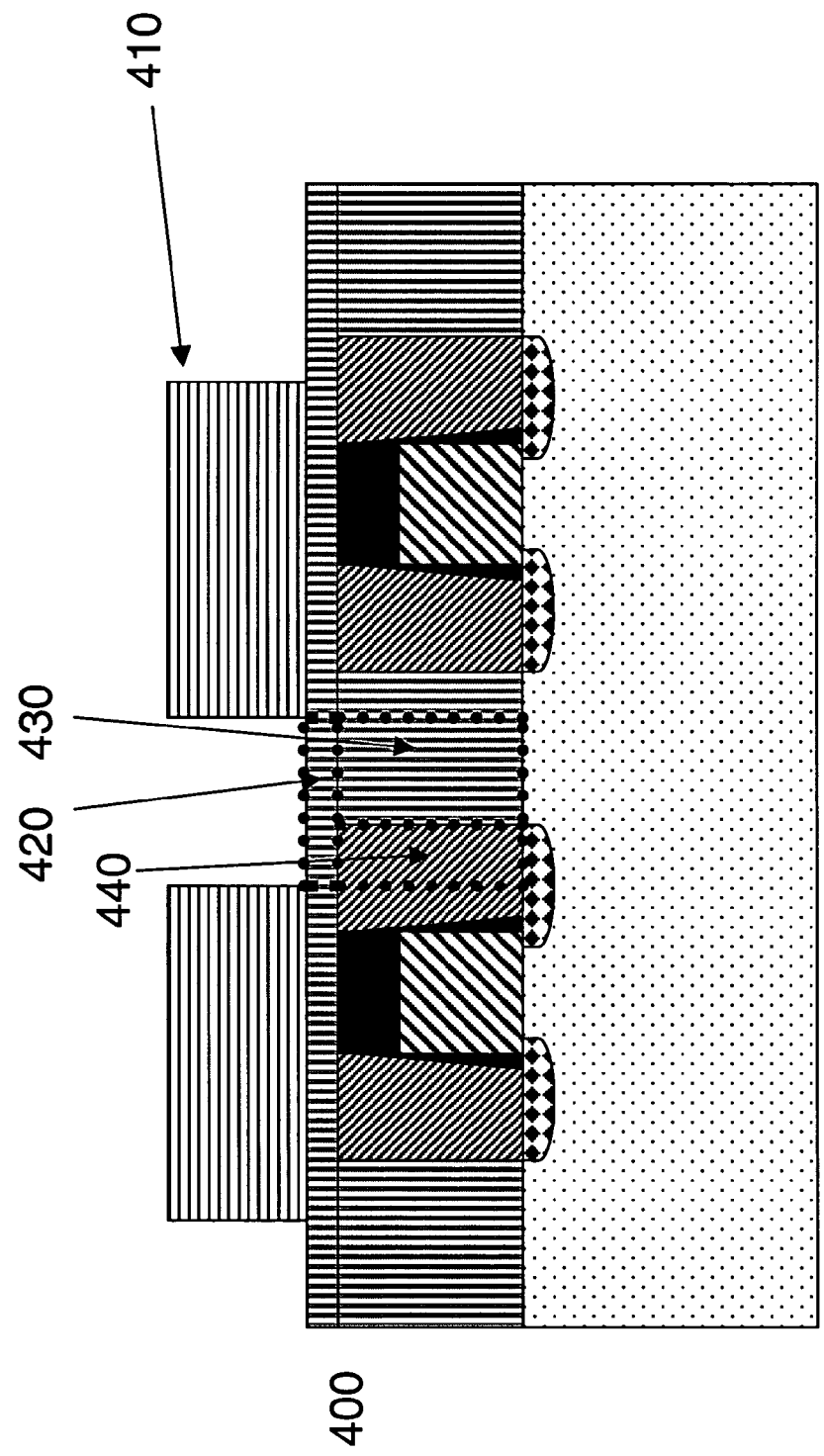

A mask 410 is applied to intermediate structure 300, as shown in FIG. 4 (for Release Layer patterning). Exposed oxide 420 (shown in dotted lines), underlying oxide 430 and underlying polysilicon 440 are removed, e.g. by, leaving intermediate structure 500.

Figure 5:
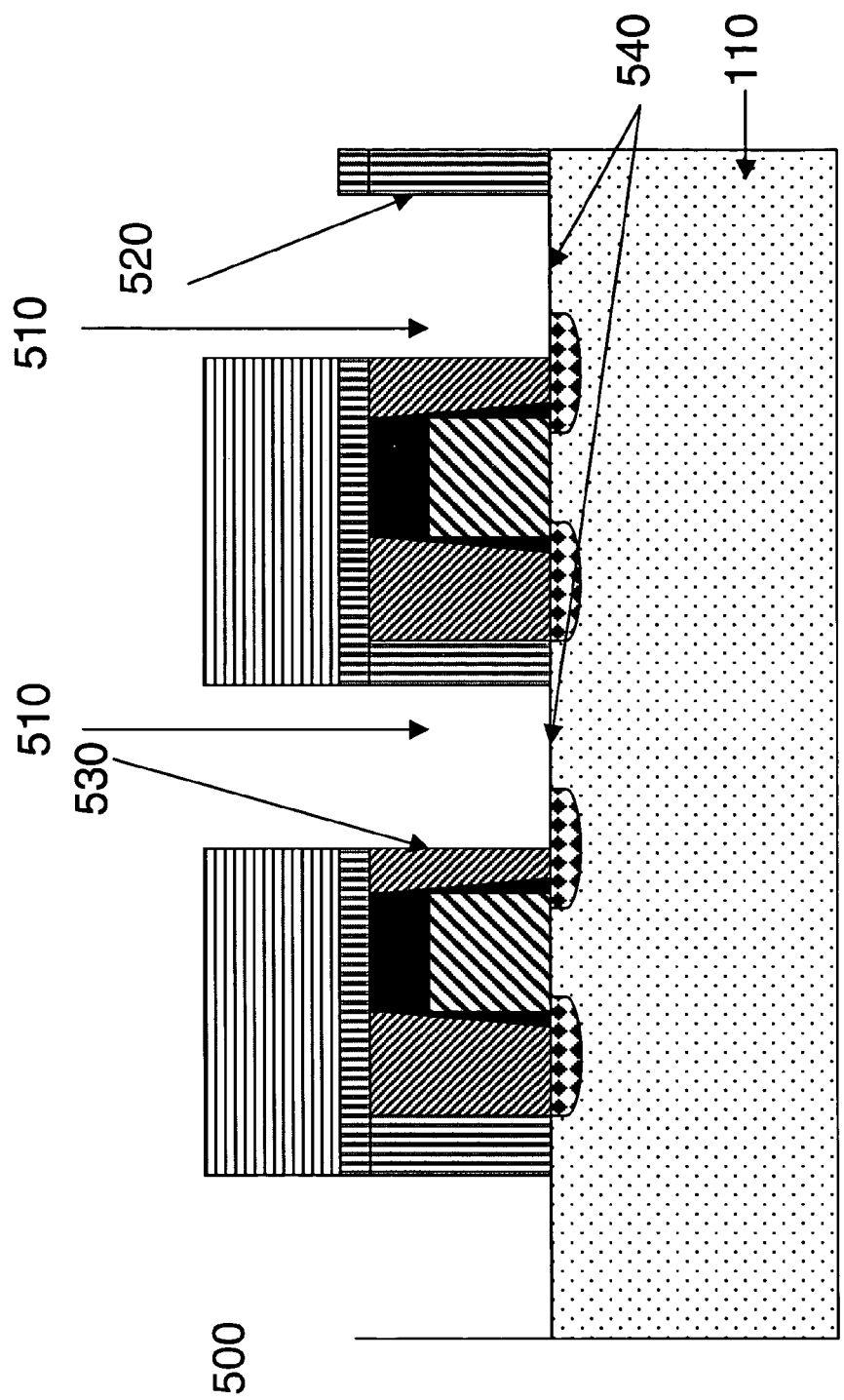

FIG. 5 illustrates intermediate structure 500, having spaces 510 defined by remaining oxide 520, remaining polysilicon 530 and substrate top surface.

Figure 6:
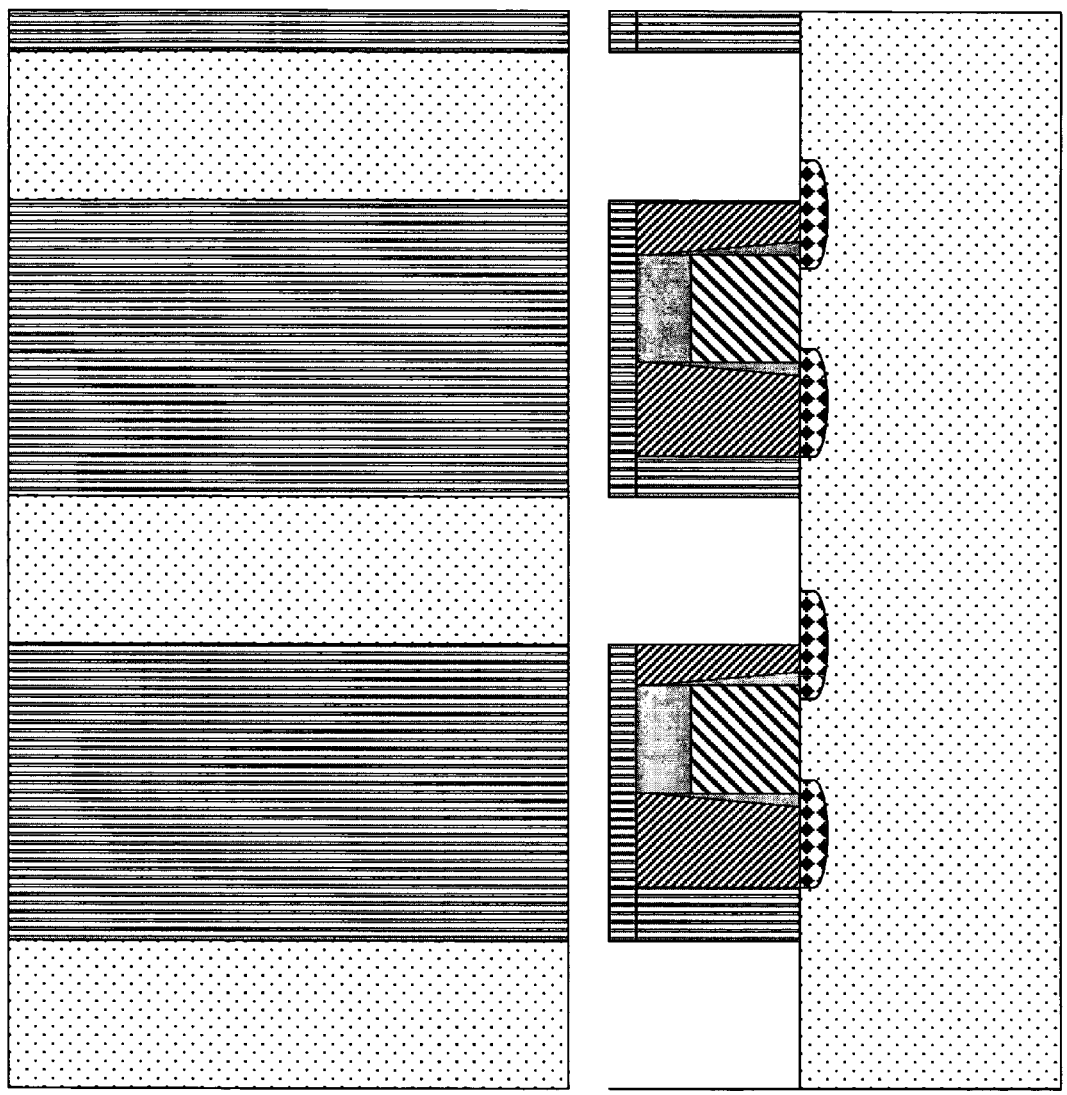
Figure 7:
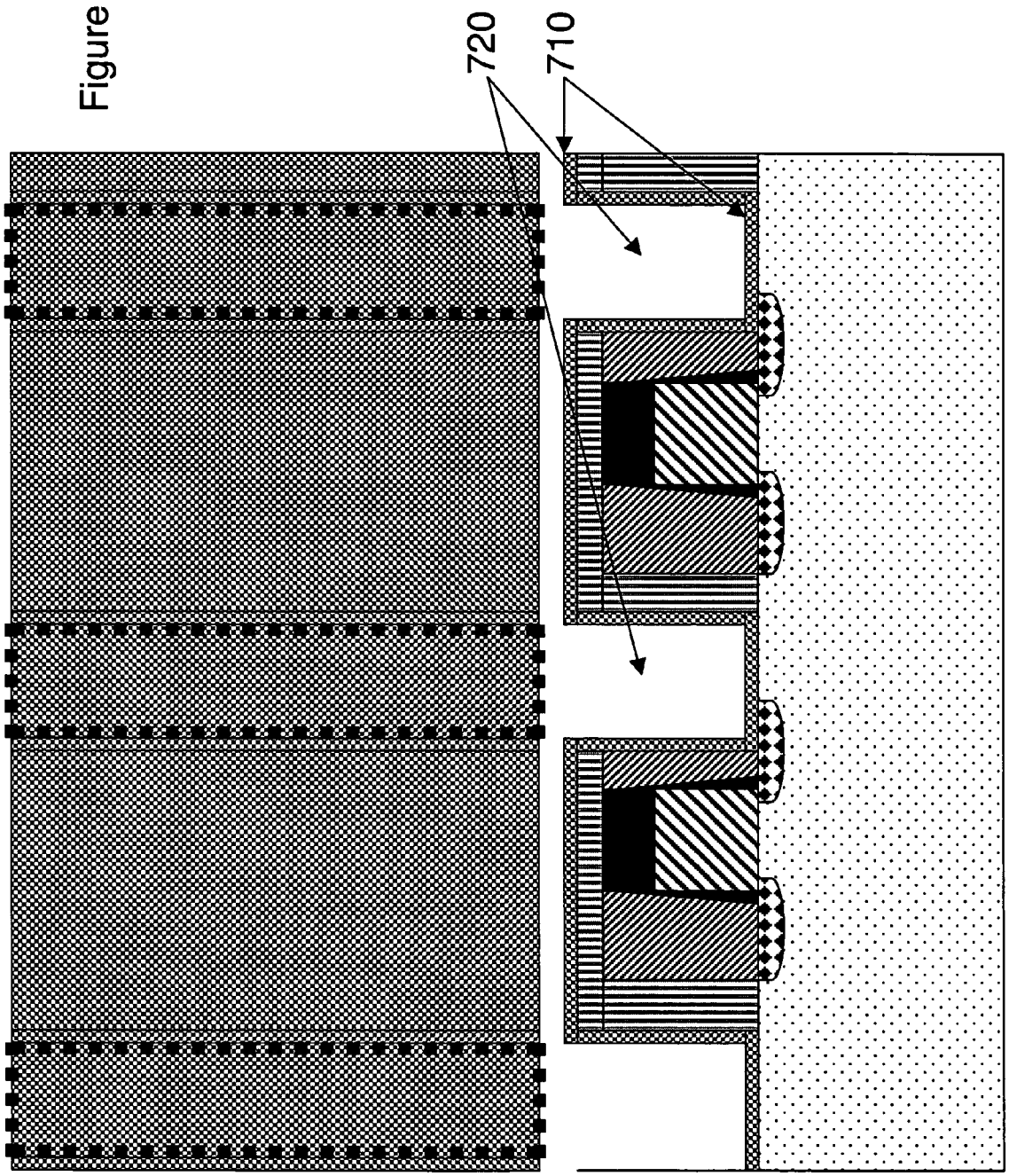
Figure 8:
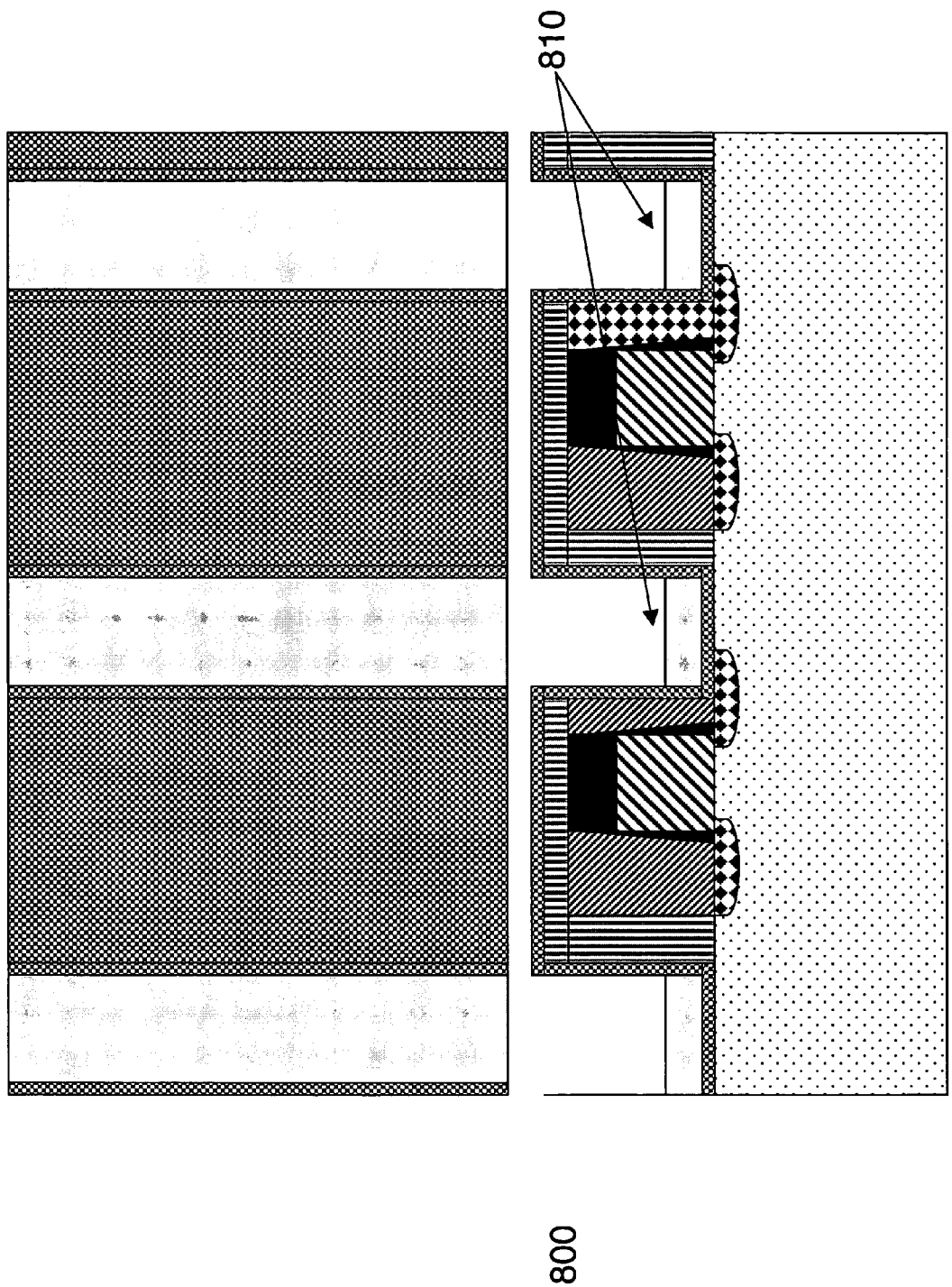

Mask 410 is stripped leaving intermediate structure 600. FIG. 6 illustrates intermediate structure 600 in cross sectional view and in plan views.

Second nitride layer 710 is applied to top surfaces of intermediate structure 600, leaving spaces 720 resulting in intermediate structure 700. It is not necessary that this layer be nitride; under preferred embodiments, a suitable insulator will also serve the desired purpose of protecting nanotubes from subsequent depositions and to create spacers of proper dimensions with selectivity in etching over polysilicon or other semiconducting or metallic materials.

Metal 810 is deposited in spaces 720, the deposition can be done in any appropriate manner including by sputtering or by evaporation followed by etching, if necessary: resulting in intermediate structure 800. Metal 810 may be any suitable conductor or semiconductor depending on the ultimate use of the article.

Figure 9:
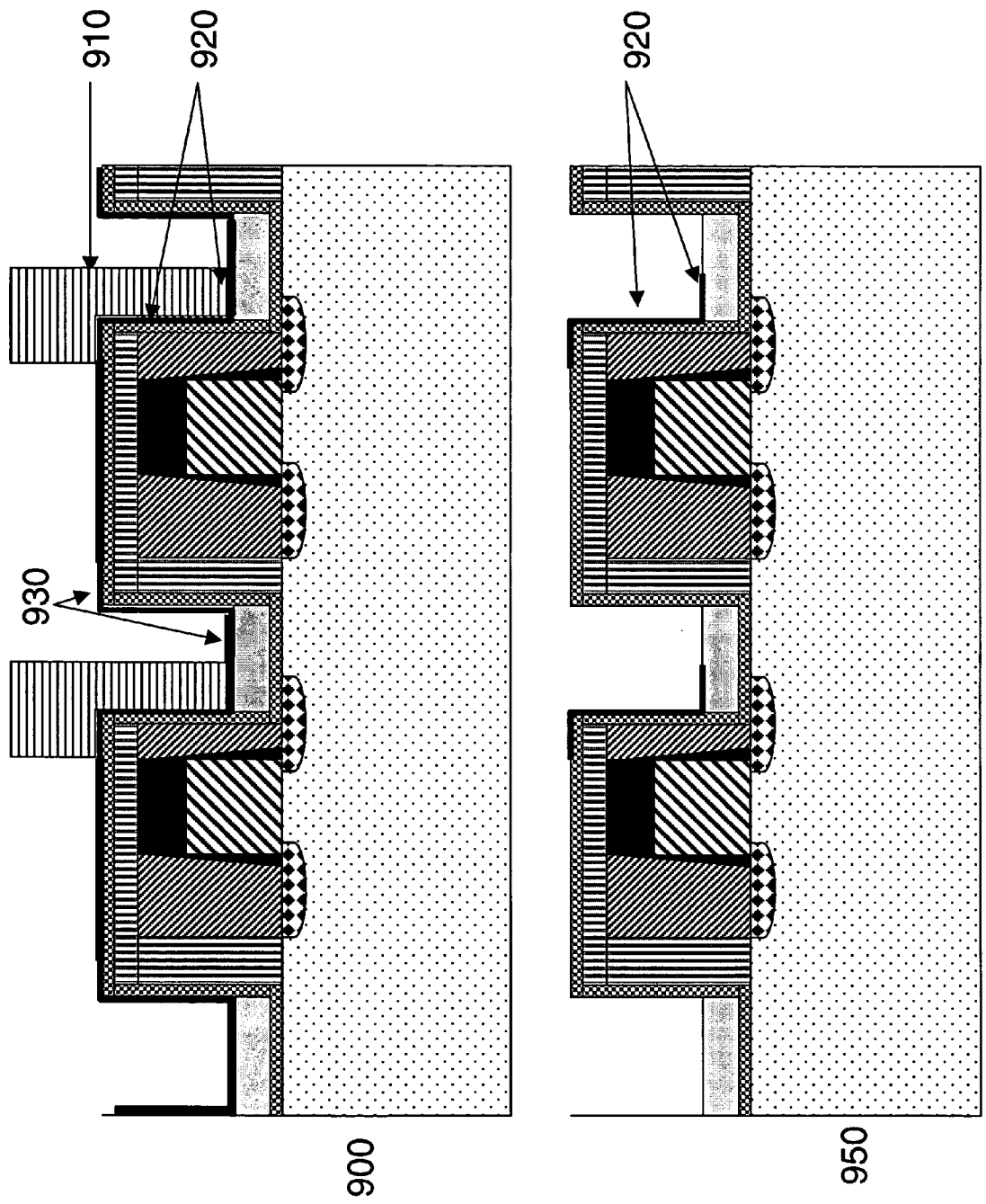

FIG. 9 illustrates patterning of a nanofabric. Nanofabric 905 is applied to intermediate structure 800. Nanofabrics are preferably created by spin coating a suspension of nanotubes onto a planar or non-planar surface as described in incorporated references Ser. Nos. 10/128,118 and 10/341,005, however nanofabrics may be applied by any appropriate means. A nanofabric patterning mask 910 is applied over desired nanofabric sections 920, as described in Ser. Nos. 09/915,095 and 10/341,005. Exposed nanofabric 930 is removed, e.g. by ashing, leaving desired nanofabric sections 920. Masks 910 are stripped, using an appropriate stripper, such that desired nanofabric sections 920 and intermediate structure 800 are left substantially intact, leaving intermediate structure 950.

Figure 10:
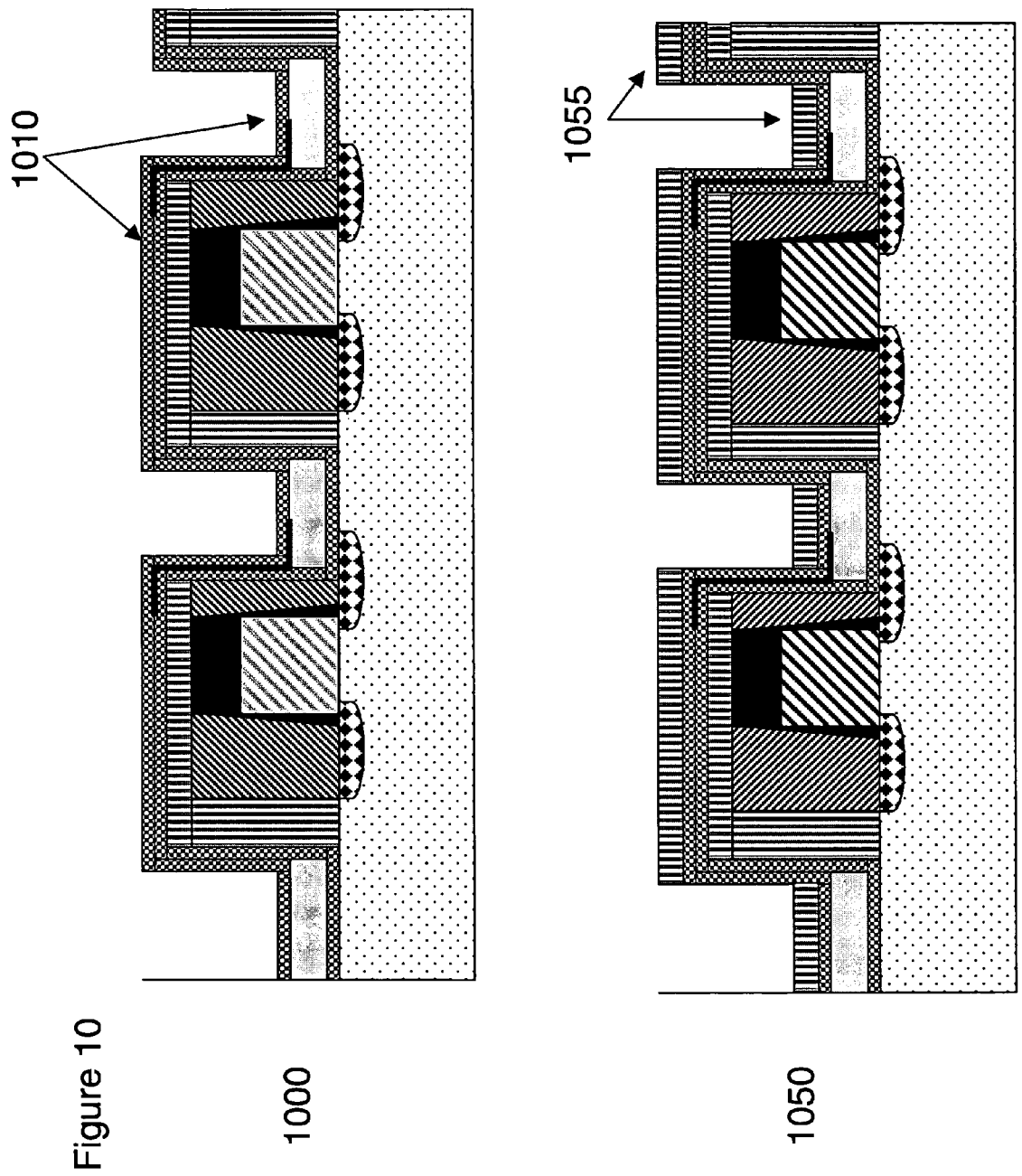
Figure 11:
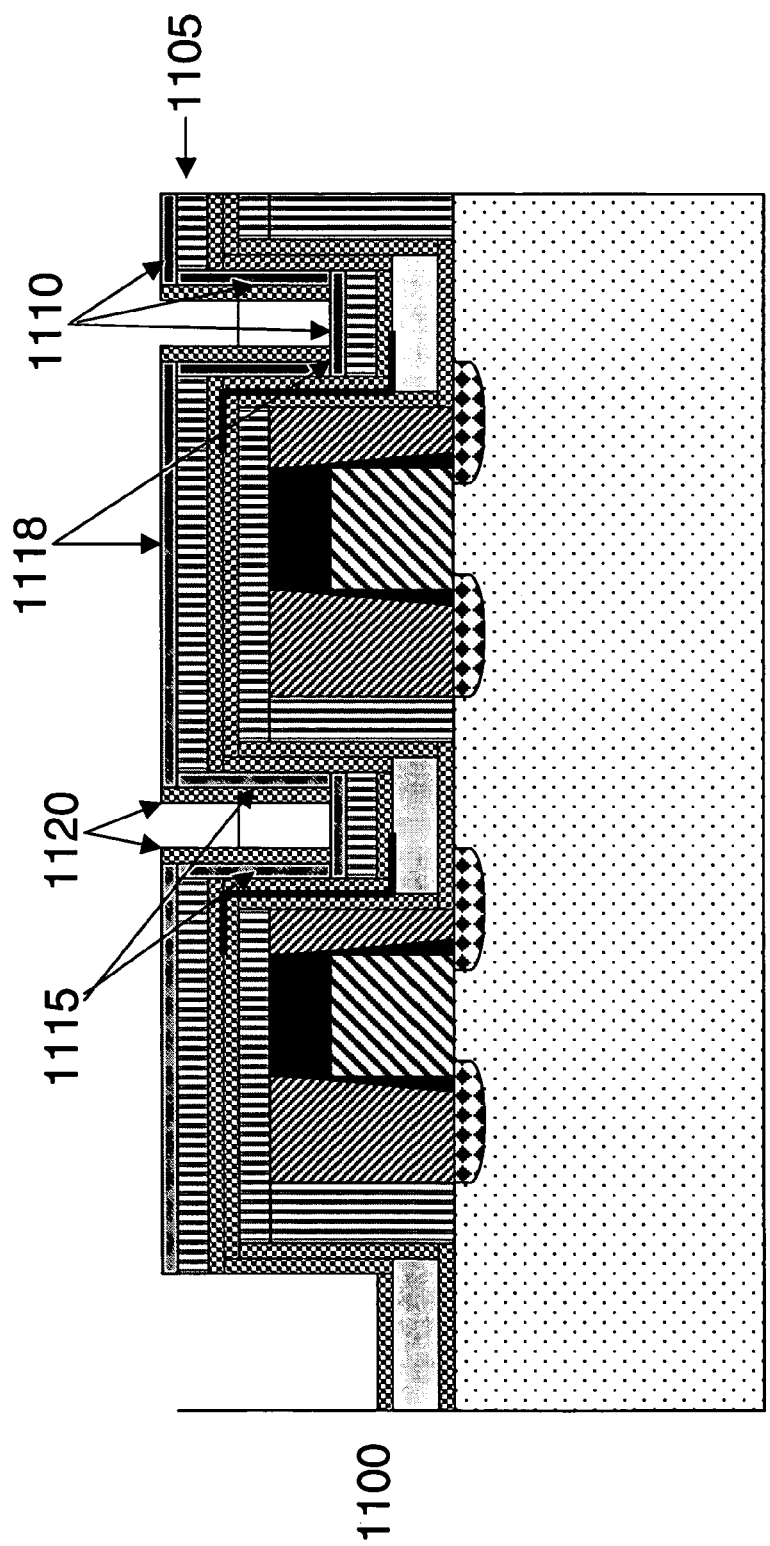
Figure 12:
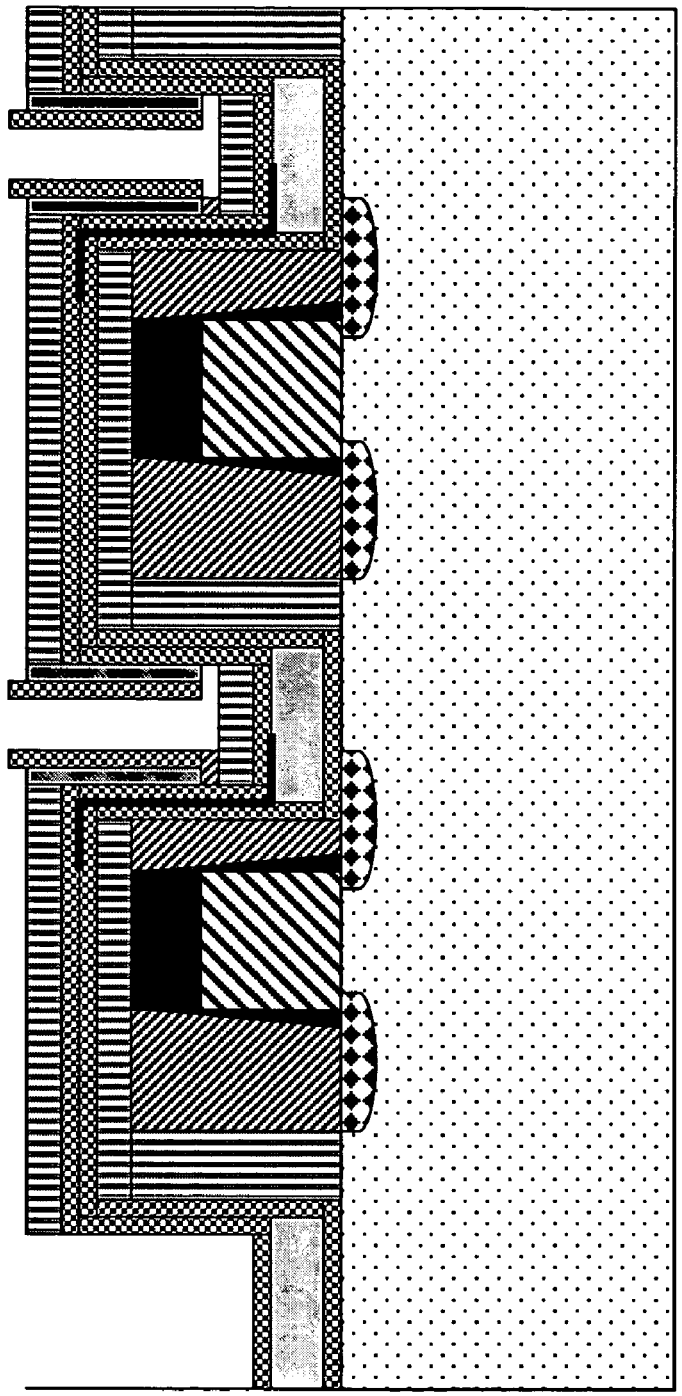

Nitride layer 1010 is applied to intermediate structure 950, creating intermediate structure 1000. Oxide 1055 is deposited on intermediate structure 1000, creating intermediate structure 1050. Oxide 1055 is deposited by any appropriate method, e.g. by use of an High Density Plasma (HDP) tool or other appropriate mechanism: thereby creating intermediate structure 1050 as illustrated in FIG. 10.

Thin polysilicon layer 1110 is applied over exposed horizontal surfaces of intermediate structure 1050. Polysilicon layer 1110 having vertical polysilicon portions 1115 and horizontal polysilicon portions 1118. A nitride spacer 1120 is formed by deposition and etching, using, e.g. RIE or other standard etch process thus creating intermediate structure 1100.

Horizontal polysilicon portions 1118 are removed, e.g. by etching to create intermediate structure 1200.

Figure 13:
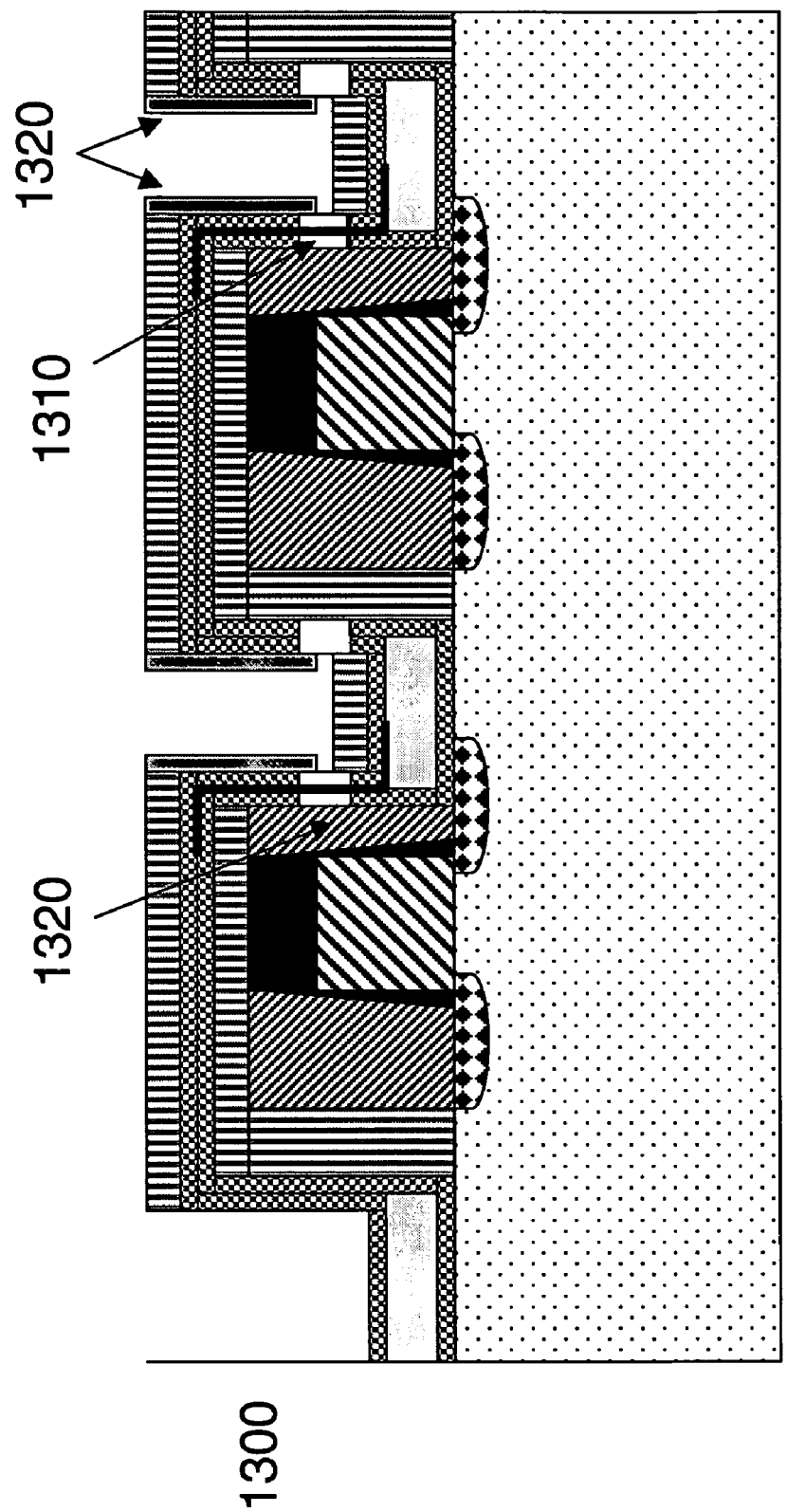
Figure 14:
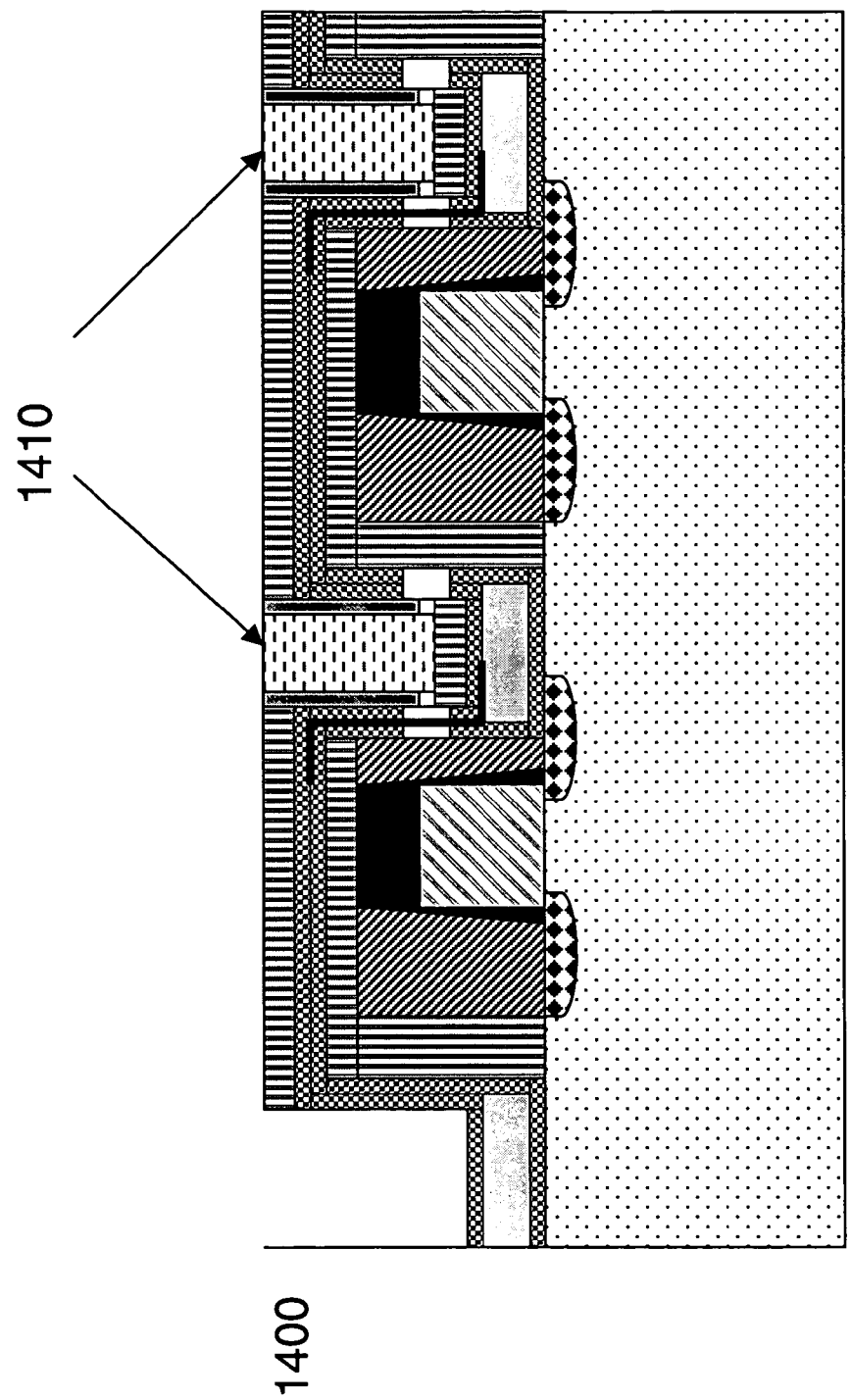

Nitride layers 710 and 1010 are isotropically etched to expose suspended nanofabric 1310 and vertical polysilicon sections 1320. The wet etchant used must etch nitride selectively over nanofabric, polysilicon and the oxide used in order to leave the nanofabric, polysilicon and oxide substantially intact. Intermediate structure 1300 is thus created and is illustrated in FIG. 13.

A conductive plug 1410 is applied between the vertical polysilicon sections 1320. Care should be taken to ensure that the spaces around suspended nanofabric 1310 are not filled in with the material of the conductive plug 1410, creating intermediate structure 1400.

Figure 15:
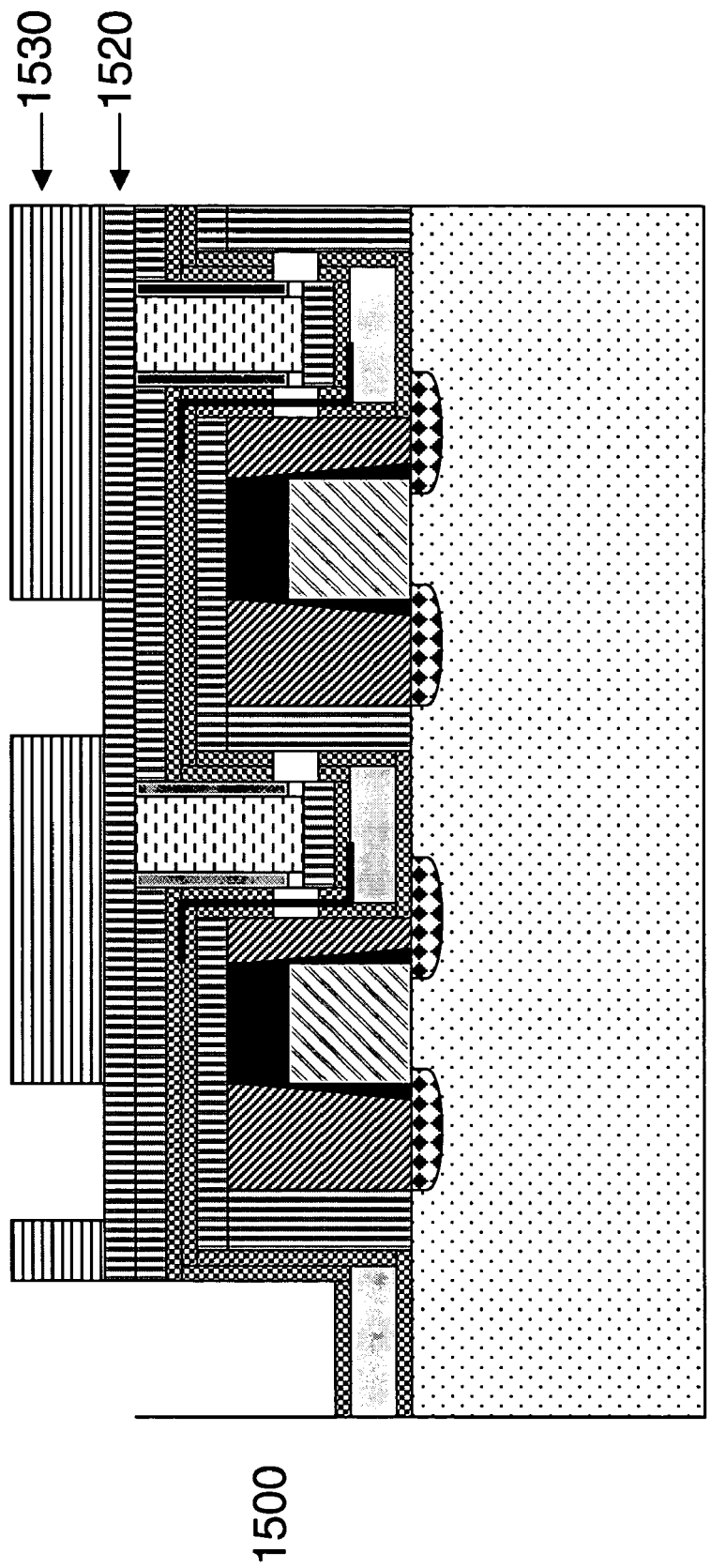
Figure 16:
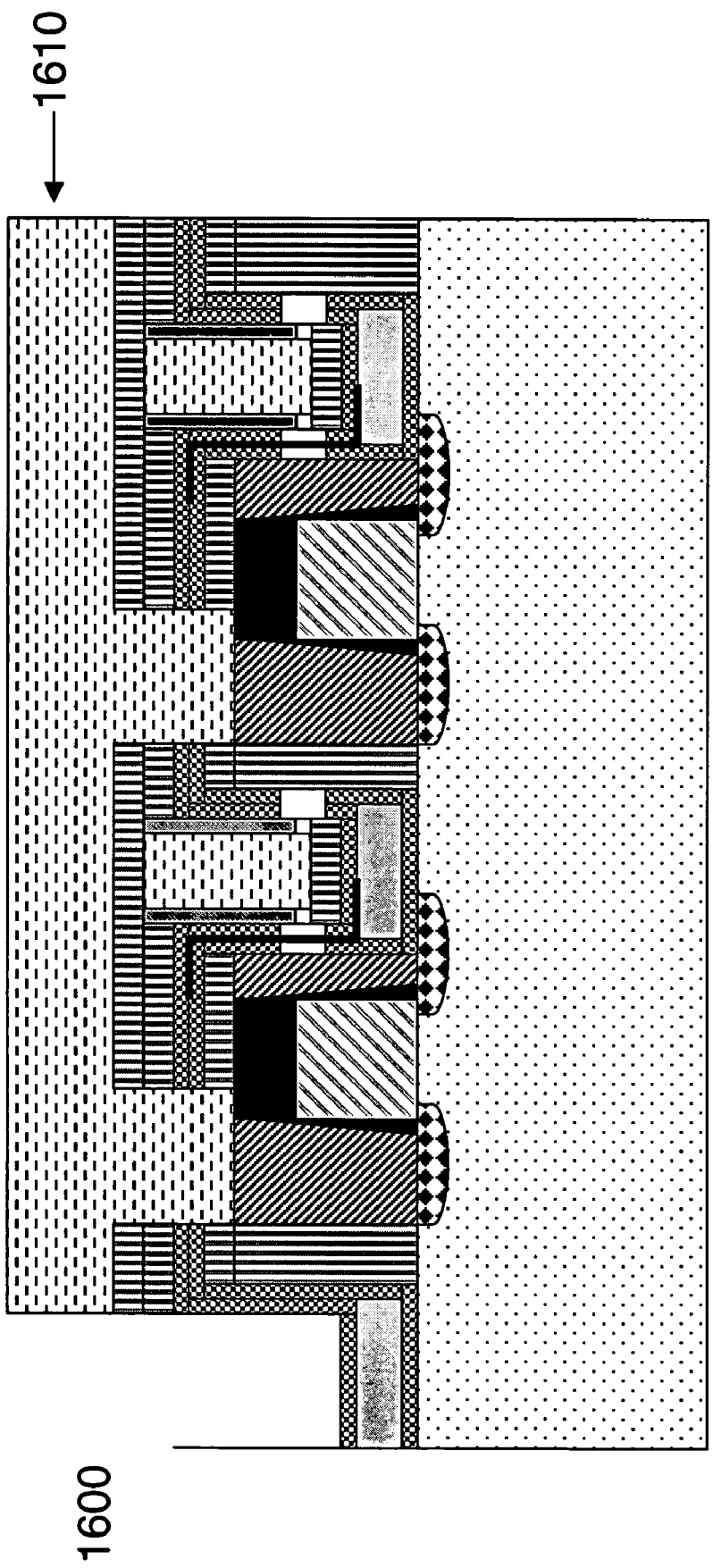

Oxide 1520 is applied to intermediate structure 1400 and mask 1530 is applied to remove exposed sections by etching down to top of surface 150 as shown in FIG. 15. For example a Damascene process is performed to interconnect to the level of top surface 150. A second mask and etch procedure and a metal deposition procedure can be carried out to create structure 1600, having metal layer 1610, as illustrated in FIG. 16.

Note that the electrodes may themselves be formed of nanofabric materials. In some embodiments, having a nanofabric ribbon or other nanofabric article disposed adjacent to the movable nanofabric element instead of a metallic electrode permits removal of sacrificial materials from below the top electrode. Fluid may flow through a nanofabric material disposed above a sacrificial layer to remove the sacrificial material. Likewise, the lower electrode may be formed of a nanofabric material if desired.

Under certain preferred embodiments, a nanotube patch has a width of about 180 nm and is strapped, clamped, or pinned to a support preferably fabricated of silicon nitride. The local area of a contact electrode e.g. 310 forms an n-doped silicon electrode and is positioned close to the supports 110 and preferably is no wider than the deflecting nanotube patch, e.g., 180 nm. The relative separation between undeflected nanotube fabric and the contact electrode, (i.e. to the deflected position where the patch attaches to electrode) should be approximately 5–50 nm. The magnitude of the separation is designed to be compatible with electromechanical switching capabilities of the memory device. For this embodiment, the 5–50 nm separation is preferred for certain embodiments utilizing patch made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube patch of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.)

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

The effect of the van der Waals interaction between nanofabrics and other elements can be affected at their interface(s). The effect may be enhanced or diminished; for example, the attractive force can be diminished by coating the surface of the electrode with a thin layer of oxide or other suitable chemicals. Volatile nanoswitches may also be made by employing such techniques instead of or in addition to controlling the gap dimension between a patch and electrode. Such volatile switches may be especially useful in applications such as relays, sensors, transistors, etc.

As the vertical separation between the patch and the underlying electrode increases, the switch becomes volatile when the deflected nanofabric has a strain energy greater than that of the van der Waals force keeping the fabric in contact with the underlying electrode. The thicknesses of insulating layers which control this separation can be adjusted to generate either a non-volatile or volatile condition for a given vertical gap as called for by particular applications with desired electrical characteristics.

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes. Numerous ways have been described, e.g. in the incorporated references, supra, for growing and manufacturing nanofabric articles and materials.

The U.S. Patent Applications, identified and incorporated above, describe several (but not limiting) uses of nanofabrics and articles made therefrom. They also describe various ways of making such nanofabrics and devices. For the sake of brevity, various aspects disclosed in these incorporated references are not repeated here. For example, the various masking and patterning techniques for selectively removing portions of the fabric are described in these applications; in addition, various ways of growing nanofabrics or of forming nanofabrics with preformed nanotubes are described in these applications.

Under certain embodiments, the technique of vertically suspending the nanotube fabric allows the suspended extent to be a function of thin film techniques. As a result, the suspended extent may be shorter than the minimum distances available with the photolithography tools being employed; that is, the suspended extent may be sub-critical-dimension.

Under certain embodiments, the fabric may be highly porous fabric of single-walled carbon nanotubes. Moreover, the fabric may be substantially a monolayer of nanotubes.

As explained in the incorporated references, a nanofabric may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric Electro-Mechanical Switches, Memory Cells Using Horizontally-Disposed Nanofabric Articles and Methods of Making the Same (U.S. Pat. Apl. Ser. No. 60/446,783) filed Feb. 12, 2003 and Memory Cells Using Vertically-Disposed Nanofabric Articles and Methods of Making the Same (U.S. Pat. Apl. Ser. No. 60/446,786) filed Feb. 12, 2003.

The articles formed by preferred embodiments help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

A nanofabric or ribbon has been shown to substantially conform to a surface, such as a surface of an article on a semiconductor substrate. A fabric of nanotubes may be constructed by any appropriate means, including, but not limited to spin coating, direct growth on a suitable substrate or other application. The fabric will be horizontally oriented when the surface of the substrate that receives the fabric is horizontally oriented. The present inventors have appreciated that devices such as electromechanical switches can be constructed using nanofabrics which have conformed to a surface which is substantially perpendicular to a semiconductor substrate (vertically-oriented) and that such devices can be used as vertically oriented switches in a plethora of applications. Fabrication techniques to develop such horizontally- and vertically-disposed fabrics and devices composed of nanotube fabrics which comprise redundant conducting nanotubes may be created via CVD, or by room temperature operations as described herein and described in applications U.S. Ser. Nos. 09/915,093, 09/915,173, 09/915,095, 10/033,323, 10/033,032, 10/128,118, 10/128,117, 10/341,005, 10/341,055, 10/341,054, 10/341,130, 60/446,783 and 60/446,786, the contents of which are hereby incorporated by reference in their entireties. Such fabrication techniques include the ability to form said switches for use in many different articles having relatively short spans of suspended nanofabric articles. In some embodiments, this allows smaller device dimensions and higher strains in the nanofabric articles, as well as lower electrical resistances. Such articles may be adapted or modified to perform logic functions or be part of a scheme involving logical functionality.

Volatile and non-volatile switches, and switching elements of numerous types of devices, can be thus created. In certain preferred embodiments, the articles include substantially a monolayer of carbon nanotubes. In certain embodiments the nanotubes are preferred to be single-walled carbon nanotubes. Such nanotubes can be tuned to have a resistance between 0.2–100 kOhm/□ or in some cases from 100 kOh/□ to 1 GOhm/□.

It will be further appreciated that the scope of the present invention is not limited to the above-described embodiments but rather is defined by the appended claims, and that these claims will encompass modifications and improvements to what has been described.

What is claimed is:

1. A method of making a device having nanotube memory elements, comprising:

providing a structure having a plurality of transistors, each with a drain and a source with a defined channel region therebetween, each transistor further including a gate over said channel;

for a predefined set of transistors, forming a corresponding trench between gates of adjacent transistors;

for each trench, providing a defined pattern of nanotube fabric over at least a horizontal portion of the structure and extending into the trench;

providing an electrode in each trench;

suspending each defined pattern of nanotube fabric so that at least a portion is vertically suspended in spaced relation to the vertical walls of the trench and positioned so that the vertically suspended defined pattern of nanotube fabric is electromechanically deflectable into electrical communication with one of the drain and source of a transistor;

providing an electrical communication path electrically connecting each electrode so that all electrodes may electro-statically attract a corresponding defined pattern of nanotube fabric away from a transistor and toward the electrode.

2. The method of claim 1 wherein the providing of a defined pattern of nanotube fabric includes the application of pre-formed nanotubes to create a layer of nanotubes.

3. The method of claim 2 wherein the layer is substantially a monolayer of nanotubes.

4. The method of claim 2 wherein the layer is a highly porous fabric of nanotubes.

5. The method of claim 2 wherein the layer of nanotubes is a conformal fabric of nanotubes.

6. The method of claim 2 wherein the nanotubes are single walled carbon nanotubes.

7. The method of claim 1 wherein the suspended length of nanotube fabric has an extent that is sub-lithographic-critical-dimension.

8. The method of claim 1 wherein the vertically suspended pattern of nanotube fabric is vertically aligned with a corresponding one of the drain or source of the transistor and is electromechanically deflectable into contact with a conductive element extending vertically from the corresponding one of the drain or source of the transistor.

* * * * *